(12) United States Patent
King

(10) Patent No.: US 6,985,552 B1
(45) Date of Patent: Jan. 10, 2006

(54) SYSTEM AND METHOD FOR GENERATING A REFERENCE CLOCK

(75) Inventor: John Alfred King, Celina, TX (US)

(73) Assignee: Applied Micro Circuits Corporation, San Diego, CA (US)

( * ) Notice: Subject to any disclaimer, the term of this patent is extended or adjusted under 35 U.S.C. 154(b) by 791 days.

(21) Appl. No.: 10/083,942

(22) Filed: Feb. 27, 2002

Related U.S. Application Data

(63) Continuation-in-part of application No. 10/044,320, filed on Jan. 10, 2002.

(51) Int. Cl.
 *H03D 3/24* (2006.01)
(52) U.S. Cl. ..................................... 375/376
(58) Field of Classification Search ............... 375/376; 331/11
See application file for complete search history.

(56) References Cited

U.S. PATENT DOCUMENTS

| | | | |
|---|---|---|---|
| 5,512,860 A * | 4/1996 | Huscroft et al. | 331/1 A |
| 2002/0121937 A1 * | 9/2002 | Marutani et al. | 331/1 A |

\* cited by examiner

*Primary Examiner*—Stephen Chin
*Assistant Examiner*—Jia Lu
(74) *Attorney, Agent, or Firm*—The Law Office of Gerald Maliszewski; Gerald Maliszewski

(57) ABSTRACT

A system and method are provided for synchronizing a reference clock to a pseudorandom non-return to zero (NRZ) data stream in a clock data recovery system. The method comprises: sampling a pseudorandom NRZ data stream; determining a mean frequency of transitions (Fd) in the data stream; determining a transition probability (P) associated with the mean frequency of transitions; using a phase/frequency detector responsive to a VCO frequency, the mean frequency of transitions, and the transition probability; in response to using the phase/frequency detector, supplying a voltage controlled oscillator tuning voltage; generating the VCO frequency responsive to the tuning voltage; using a XOR phase detector to compare the VCO frequency to the NRZ data stream; in response to using the XOR phase detector, supplying a voltage controlled oscillator tuning voltage; and, generating the VCO frequency responsive to the tuning voltage. Also provided are a system and method for synchronizing a reference clock to a pseudorandom non-return to zero data stream in a clock data recovery system, and a system and method for generating a reference clock in the absence of a pseudorandom non-return to zero (NRZ) data stream in a system including a clock data recovery (CDR) unit.

37 Claims, 8 Drawing Sheets

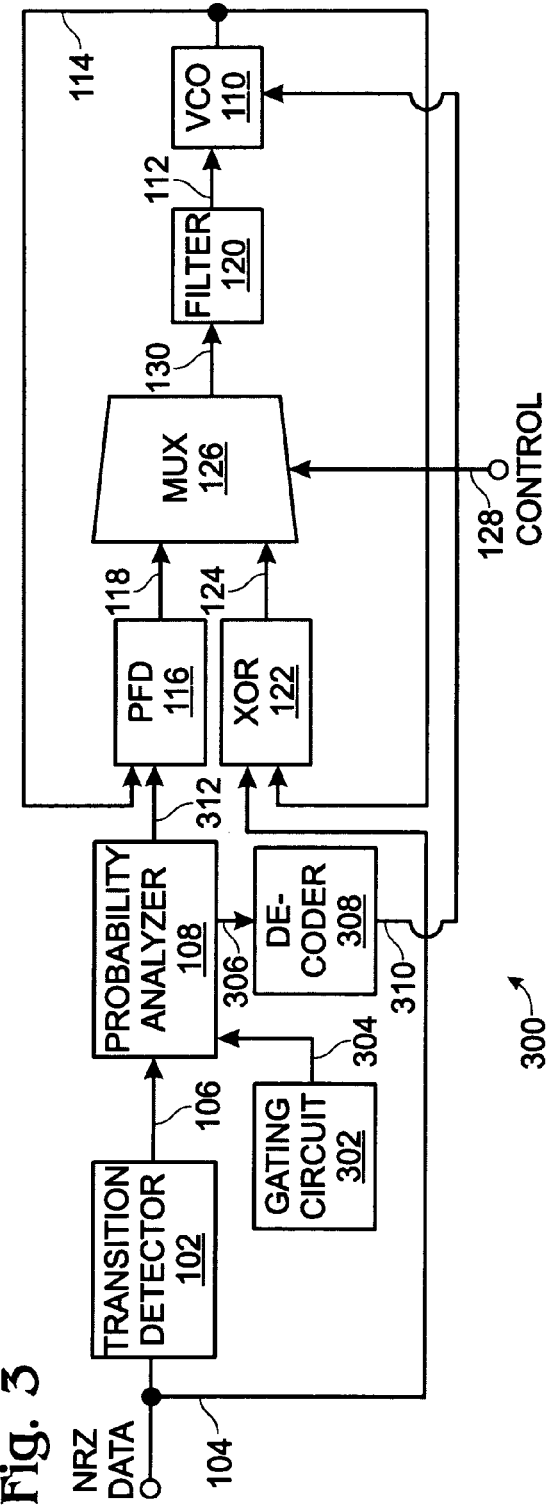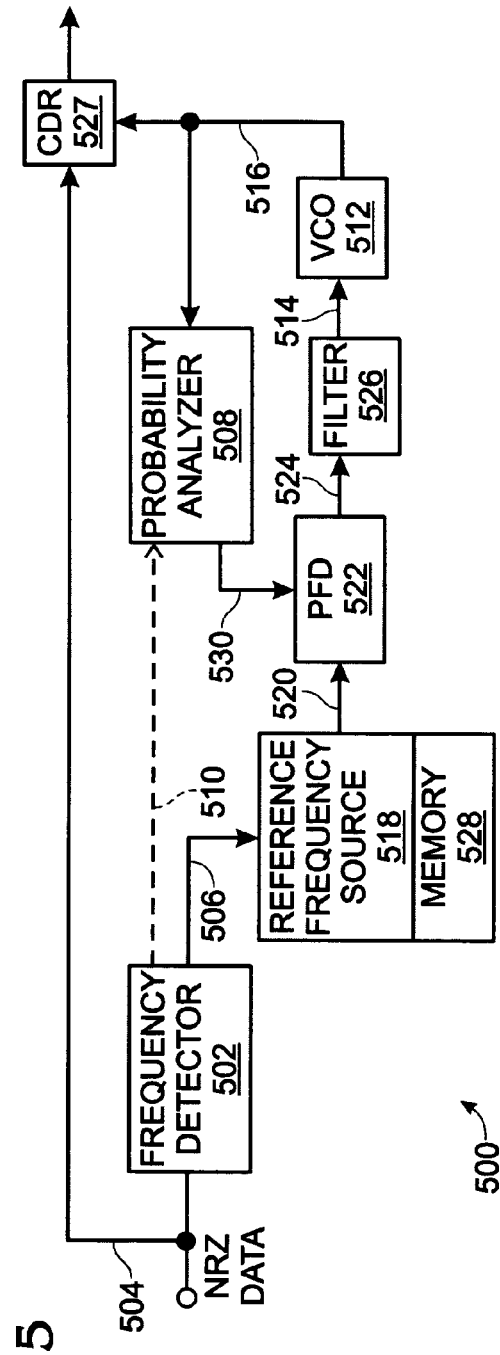

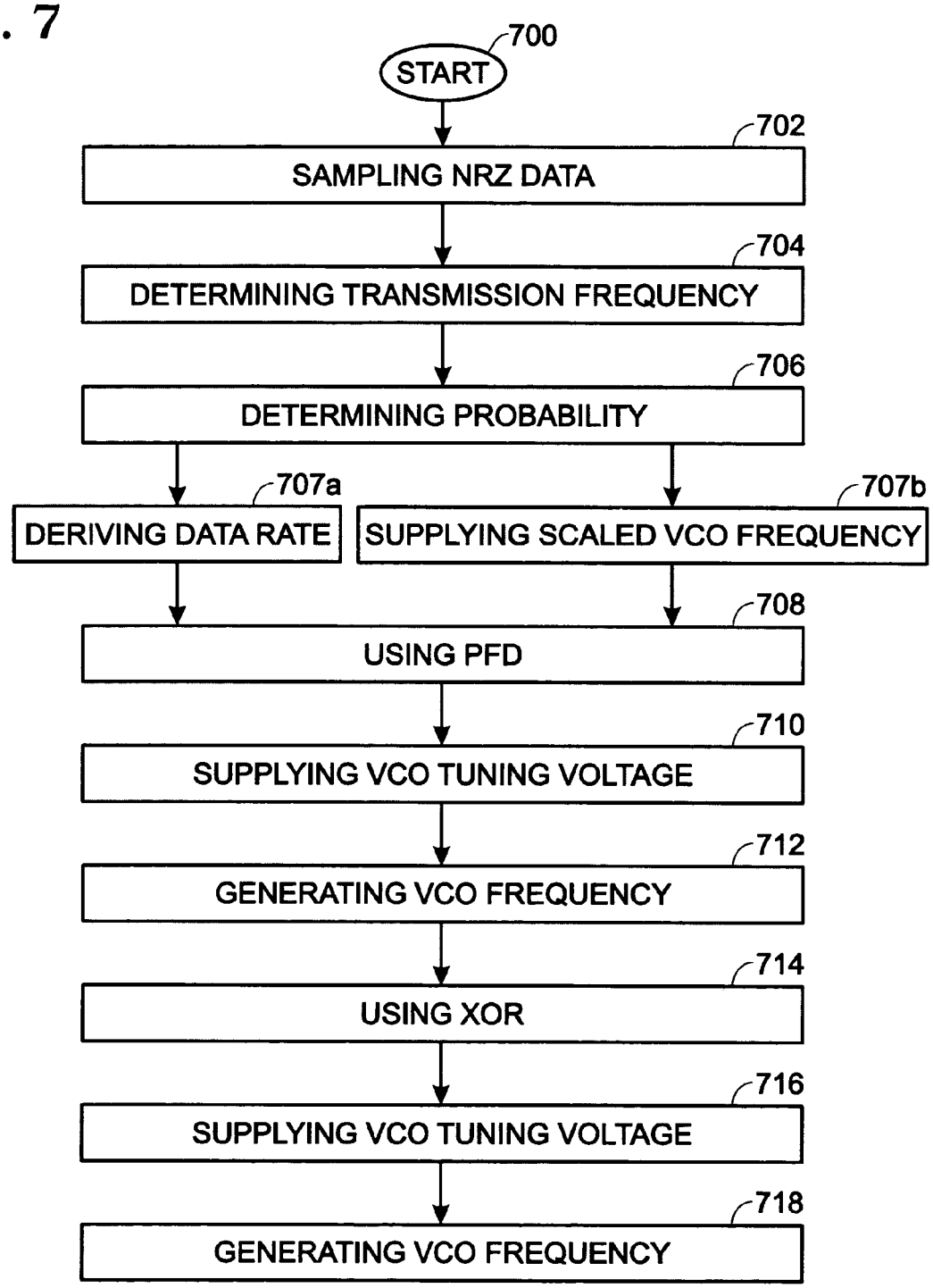

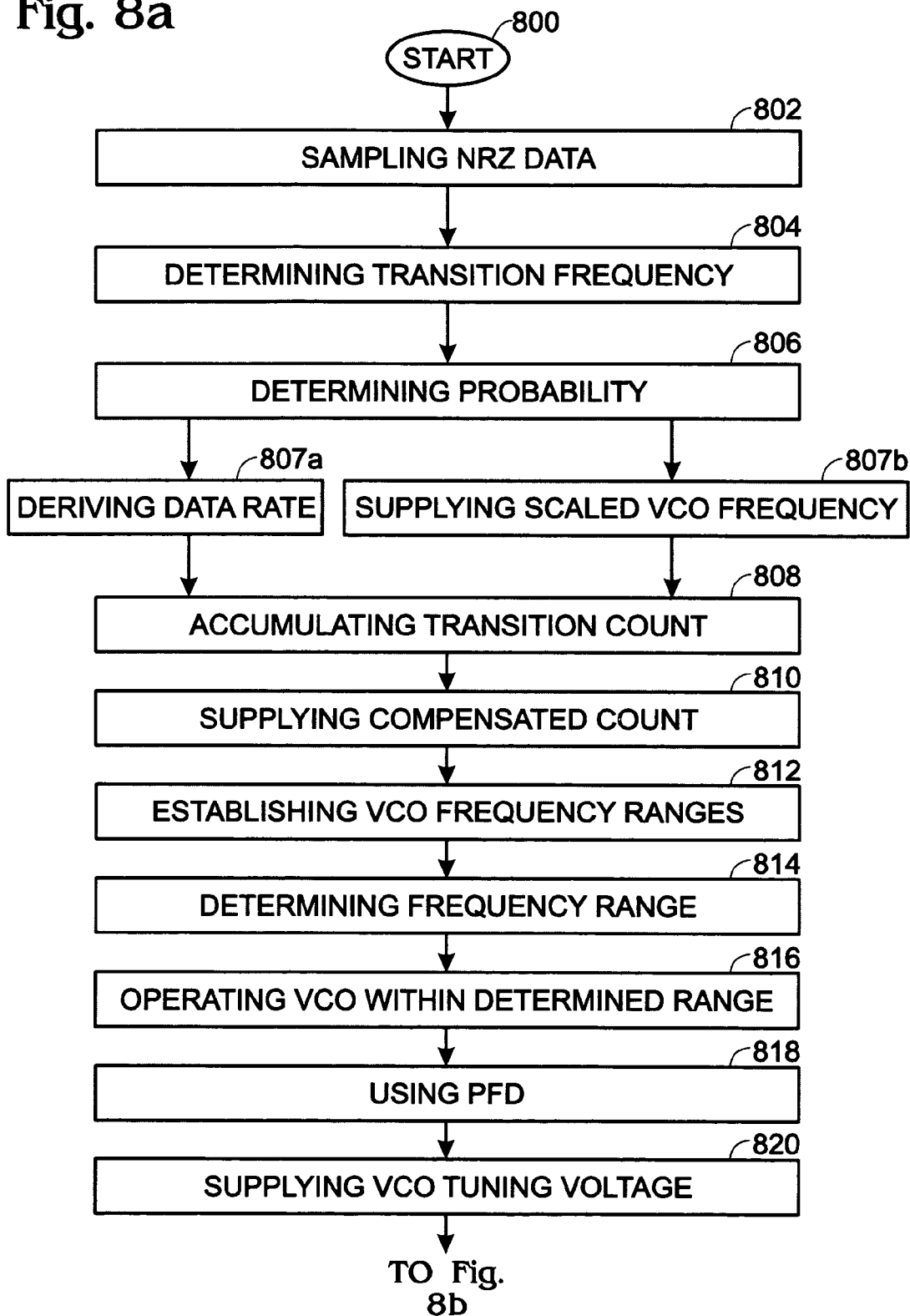

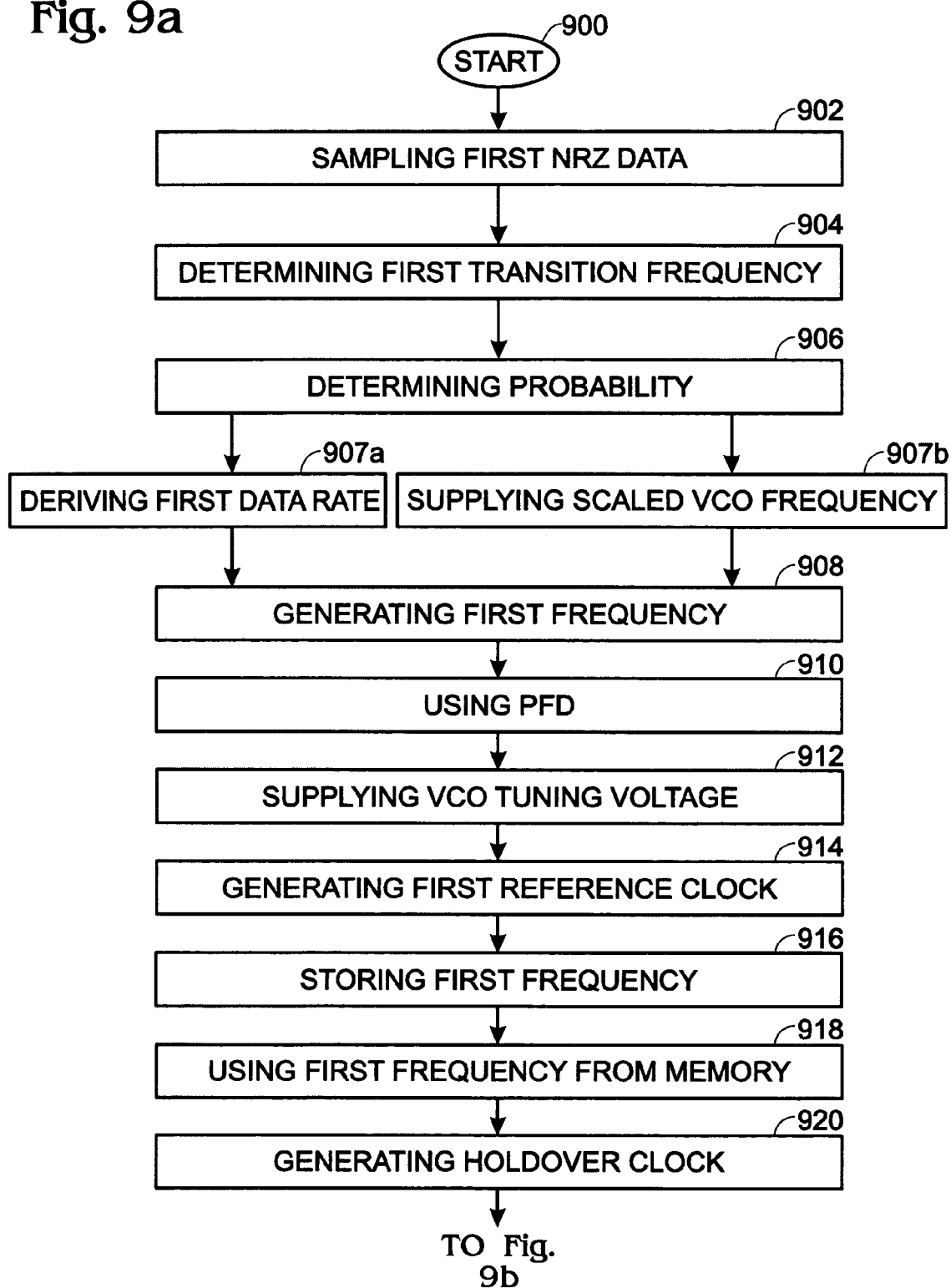

SYSTEM AND METHOD FOR GENERATING A REFERENCE CLOCK

RELATED APPLICATIONS

This application is a continuation-in-part of a pending application entitled, SYSTEM AND METHOD FOR MEASURING DATA STREAM RATES, invented by John King, Ser. No. 10/044,320, filed Jan. 10, 2002.

BACKGROUND OF THE INVENTION

1. Field of the Invention

This invention generally relates to binary non-return to zero (NRZ) communications and, more particularly, to a system and method for acquiring voltage controlled oscillator (VCO) frequency ranges, generating a reference clock, and for generating a recovered clock in the absence of a data stream.

2. Description of the Related Art

Voltage controlled ring oscillators are commonly used in monolithic clock data recovery (CDR) units, as they're easy to fabricate provide reliable results. Ring oscillators obtain their tuning characteristics by changing the variable delay around the ring, usually in response to a dedicated control voltage input (tuning voltage). Voltage controlled ring oscillators can, and usually do exhibit a tuning range much wider than the closed loop PLL bandwidth of the circuits in which they operate.

Clock recovery phase-locked loops (PLLs) generally don't use phase-frequency detectors (PFDs) in the data path since the incoming data signal isn't deterministic. PFDs are more typically used in frequency synthesizers with periodic (deterministic) signals. Clock recovery PLLs use exclusive-OR (XOR) based phase detectors to maintain quadrature phase alignment between the incoming data pattern and the re-timed pattern. XOR based phase detectors have limited frequency discrimination capability, generally restricting frequency offsets to less than the closed loop PLL bandwidth. This characteristic, coupled with the wide tuning range of the VCO, requires CDR circuits to depend upon an auxiliary frequency acquisition system.

There are two basic PLL frequency acquisition techniques. The first is a VCO sweep method. During an out-of-lock condition, auxiliary circuits cause the VCO frequency to slowly sweep across its tuning range in search of an input signal. The sweeping action is halted when a zero-beat note is detected, causing the PLL to lock to the input signal. The VCO sweep method is generally used in microwave frequency synthesis applications. The second type of acquisition aid, commonly found in clock recovery circuits, uses a PFD in combination with an XOR phase detector. When the PLL isn't locked to a data stream, the PLL switches over to a PFD that is driven by a stable reference clock source. The reference clock frequency is approximately equal to the data stream rate. Thus, the VCO frequency is held very close to the data rate. Keeping the VCO frequency in the proper range of operation facilitates acquisition of the serial data and maintains a stable downstream clock when serial data isn't present at the CDR input. When serial data is applied to the CDR, the XOR based phase detector replaces the PFD, and data re-timing resumes.

It would be advantageous if a CDR or a clock synthesis unit (CSU) had the ability to operate over a broad range of clock frequencies.

It would be advantageous if the CDR/CSU units could simultaneously maintain clock stability when the data stream to the receiver input is lost.

It would also be advantageous if the CDR/CSU units had an automatic data stream rate detection system.

SUMMARY OF THE INVENTION

The present invention automatic data stream rate measuring system can be used as an acquisition aid for phase-locked loops in clock recovery applications. The system examines transitions in the data stream, counting those events in a given time frame, or logging the time required to accumulate a fixed count. Whether it be time or event counting, the results can be decoded into frequency band information pulling the VCO frequency into the correct range of operation, establishing a reference clock frequency for support during serial data outages, and enabling clock recovery action on the data stream.

The data stream rate measuring system can also enable a PLL to self-reference itself. Self-referencing is the ability of the measuring system to extract a deterministic signal from the data stream, and use it to pull the VCO on-frequency. Applications that don't require holdover clock stability during serial data outages can benefit from this feature by eliminating the reference clock source completely.

Accordingly, a method is provided for synchronizing a reference clock to a pseudorandom non-return to zero (NRZ) data stream in a clock data recovery system. The method comprises: sampling a pseudorandom NRZ data stream; determining a mean frequency of transitions (Fd) in the data stream; determining a transition probability (P) associated with the mean frequency of transitions; using a phase/frequency detector responsive to a VCO frequency, the mean frequency of transitions, and the transition probability; in response to using the phase/frequency detector, supplying a voltage controlled oscillator tuning voltage; generating the VCO frequency responsive to the tuning voltage; using a XOR phase detector to compare the VCO frequency to the NRZ data stream; in response to using the XOR phase detector, supplying a voltage controlled oscillator tuning voltage; and, generating the VCO frequency responsive to the tuning voltage.

Also provided is a method for synchronizing a reference clock to a pseudorandom non-return to zero data stream in a clock data recovery system. The method comprises: sampling a pseudorandom NRZ data stream; determining a mean frequency of transitions (Fd) in the data stream; determining a transition probability associated with the mean frequency of transitions; accumulating a mean transition count (Np) of frequency transitions over a gate time period (Td); supplying a compensated transition count (Nc), where Nc=Np/P; establishing a plurality of VCO frequency ranges; determining a frequency range corresponding to the compensated transition count; operating the voltage controlled oscillator within the determined frequency range; using a phase/frequency detector responsive to the VCO frequency, the mean frequency of transitions, and the transition probability; in response to using the phase/frequency detector, supplying a voltage controlled oscillator tuning voltage; generating the VCO frequency responsive to the tuning voltage; using a XOR phase detector to compare the VCO frequency to the NRZ data stream; in response to comparing, supplying a voltage controlled oscillator tuning voltage; and, generating the VCO frequency responsive to the tuning voltage.

A method is provided for generating a reference clock in the absence of a pseudorandom NRZ data stream in a system including a clock data recovery (CDR) unit. The method comprises: sampling a first pseudorandom NRZ data stream; determining a first mean frequency of transitions (Fd1) in the first data stream; determining a transition probability (P) associated with the first mean frequency of transitions (P); generating a first reference source frequency responsive to the first mean frequency of transitions; using a phase/frequency detector responsive to the reference source frequency, the transition probability, and a voltage controlled oscillator frequency; in response to using the phase/frequency detector, supplying a voltage controlled oscillator tuning voltage; generating a voltage controlled oscillator frequency first reference clock (refclk1) responsive to the tuning voltage; storing the first reference source frequency; in the absence of a NRZ data stream, using the first reference frequency in memory; and, generating a voltage controlled oscillator frequency holdover clock responsive to the first reference source frequency.

Additional details of the above-described methods, as well as corresponding system applications are presented below in greater detail.

BRIEF DESCRIPTION OF THE DRAWINGS

FIG. 3 is a schematic block diagram illustrating the present invention system for synchronizing a reference clock to a pseudorandom NRZ data stream.

FIG. 5 is a schematic block diagram illustrating the present invention system for generating a reference clock in the absence of a pseudorandom NRZ data stream.

FIG. 7 is a flowchart illustrating the present invention method for method for synchronizing a reference clock to a pseudorandom NRZ data stream, in a clock data recovery system including a VCO and a PFD.

FIGS. 8a and 8b are flowcharts illustrating a method for synchronizing a reference clock to a pseudorandom NRZ data stream, in a clock data recovery system including a VCO and a PFD.

FIGS. 9a and 9b are flowcharts illustrating the present invention method for generating a reference clock in the absence of a pseudorandom NRZ data stream, in a system including a clock data recovery unit, a VCO, a PFD, and a reference frequency source.

DETAILED DESCRIPTION OF THE PREFERRED EMBODIMENTS

Figure 1:
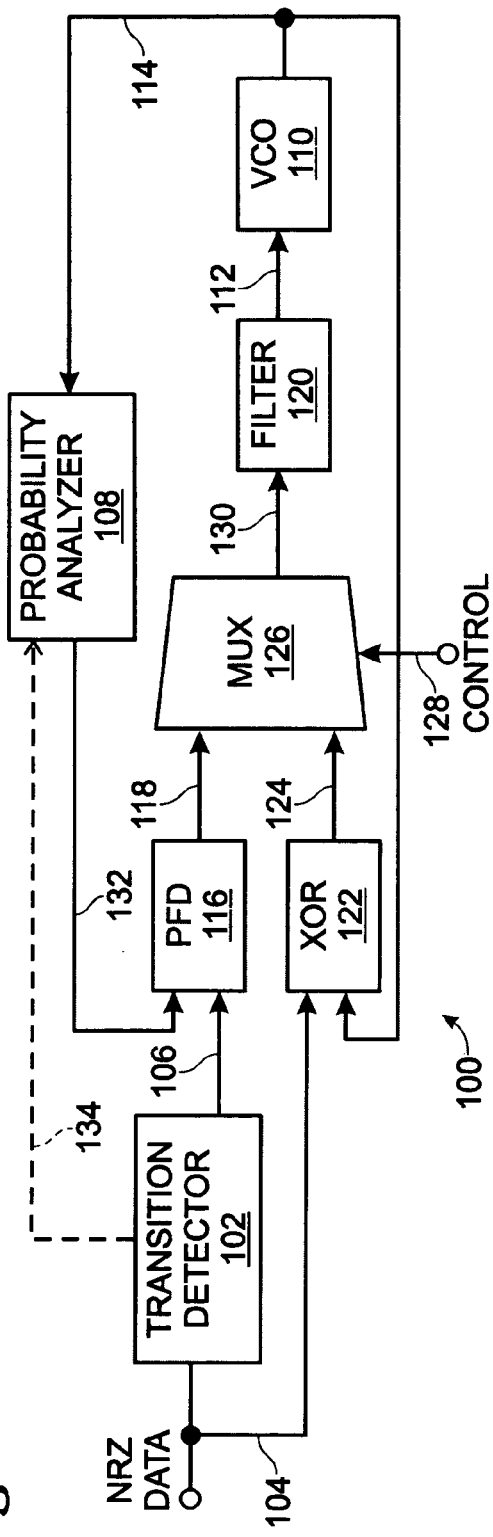
FIG. 1 is a schematic block diagram of the present invention system for synchronizing a reference clock to a pseudorandom non-return to zero (NRZ) data stream.

FIG. 1 is a schematic block diagram of the present invention system for synchronizing a reference clock to a pseudorandom non-return to zero (NRZ) data stream. The invention can be enabled in a communications device integrated circuit (IC) or as discrete components. The system 100 comprises a transition detector 102 having an input on line 104 to sample a pseudorandom NRZ data stream and an output on line 106 to supply a mean frequency of transitions (Fd). A probability analyzer 108 determines the transition probability (P) for the mean frequency of transitions.

A voltage controlled oscillator (VCO) 110 has an input on line 112 to accept a tuning voltage and an output on line 114 to supply a voltage controlled oscillator frequency responsive to the tuning voltage. A phase/frequency detector (PFD) 116 is responsive to the mean frequency of transitions on line 106, the transition probability, and the VCO frequency. The phase/frequency detector 116 has an output on line 118 to supply the tuning voltage. Typically, the tuning voltage is filtered by a loop-filter (F(s)) 120.

An exclusive-OR (XOR) phase detector 122 having inputs to receive the NRZ data stream on line 104 and the voltage controlled oscillator frequency on line 114. The exclusive-OR phase detector 122 has an output on line 124 to supply the tuning voltage. A multiplexer 126 has signal inputs on lines 124 and 118 connected respectively to the XOR and phase/frequency detector outputs. A control input on line 128 is used to select a signal input (line 118 or line 124) and an output on line 130 connected to the voltage controlled oscillator input, typically through the loop-filter 120. The multiplexer 126 selects the phase/frequency detector output on line 118 to acquire the NRZ data stream, and selects the XOR phase detector output on line 124 to track the NRZ data stream, after acquisition.

The probability analyzer has an input to receive the VCO frequency on line 114. The probability analyzer 108 multiplies the VCO frequency by P, to supply a scaled VCO frequency at an output on line 132. Information regarding the mean frequency of transitions, from which P is calculated, is communicated on line 134. The phase/frequency detector 116 has a first input connected to the output of the transition detector 102 on line 106 to accept the mean frequency of transitions (Fd) and a second input connected to the output of the probability analyzer 108 on line 132 to accept the scaled VCO frequency. Note that when either Fd or P is a known value, the probability analyzer 108 can be replaced with a simpler fixed divider circuit.

Figure 2:
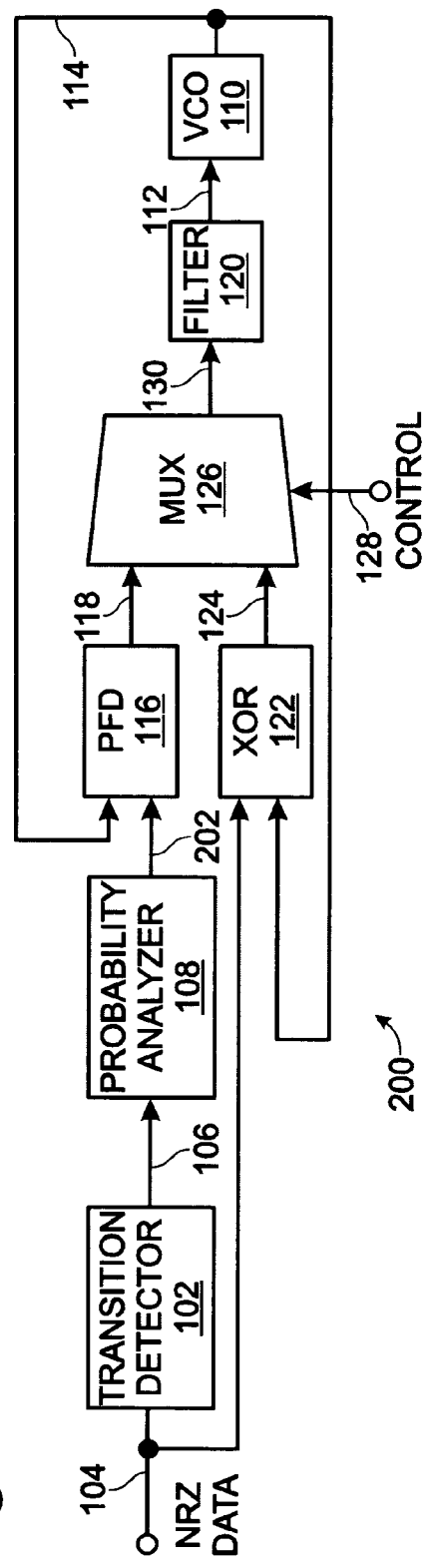
FIG. 2 is a schematic block diagram illustrating an alternate aspect of the system of FIG. 1.

FIG. 2 is a schematic block diagram illustrating an alternate aspect of the system 100 of FIG. 1. In the system 200 of FIG. 2, the probability analyzer 108 has an input on line 106 to receive mean frequency of transitions from the transition detector 102. The probability analyzer 108 compares the mean frequency of transitions to the transition probability to supply a mean data stream rate (B) at an output on line 202, where B=Fd/P. The phase/frequency detector 116 has a first input connected to the output of the probability analyzer 108 on line 202 to accept the mean data stream rate and a second input connected to the output of the VCO 110 on line 114 to accept the VCO frequency.

With respect to either FIG. 1 or 2, the transition detector 102 determines a mean frequency of transitions (Fd) in the data stream on line 104 by monitoring: positive transitions having a 0.25 probability of occurrence; negative transitions having a 0.25 probability of occurrence; or, both positive and negative transitions having a 0.5 probability of occurrence. The transition detector 102 samples n data bits and determines a mean frequency of transitions with a standard deviation as follows:

$$\sigma = SQRT((P)(1-P)(n)).$$

FIG. 3 is a schematic block diagram illustrating the present invention system for synchronizing a reference clock to a pseudorandom NRZ data stream. As above, the invention is realized as either a communications device IC or a plurality of discrete parts. The system 300 comprises a transition detector 102 having an input on line 104 to sample a pseudorandom NRZ data stream and an output on line 106 to supply a mean frequency of transitions (Fd). A gating circuit 302 has an output on line 304 to supply a gate time period (Td). A probability analyzer 108 has an input on line 106 to receive the mean frequency of transitions and an input on line 304 to accept the gate time period. The probability analyzer 108 compares a transition count of the mean frequency of transitions to a transition probability (P) and supplies a compensated transition count at an output on line 306.

Figure 4:
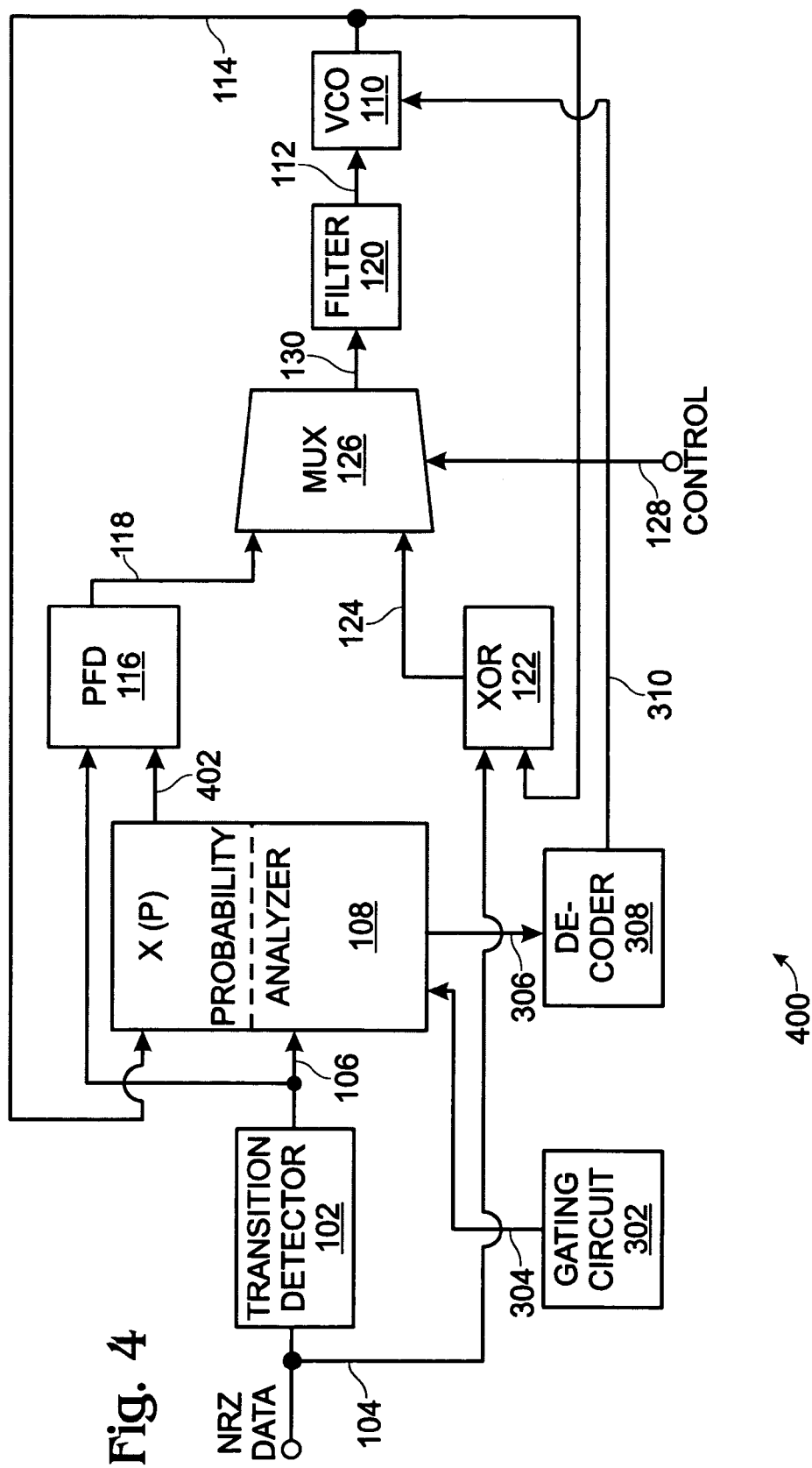
FIG. 4 illustrates an alternate aspect of the invention of FIG. 3, where the probability analyzer acts as a factor of P scalar in the feedback path between the VCO and the PFD.

A decoder 308 has an input to accept the compensated transition count. The decoder 308 determines a frequency range corresponding to the compensated transition count and supplies a frequency range selection command at an output on line 310. The phase/frequency detector (PFD) 116 is responsive to the mean frequency of transitions on line 106, the transition probability, and the VCO frequency on line 114. There are two version of the system as shown in FIG. 3 and FIG. 4, and as explained below. The phase/frequency detector 116 has an output on line 118 to supply the tuning voltage.

A multiband voltage controlled oscillator (VCO) 110 has an input on line 112 to accept the tuning voltage, an input on line 310 to accept the frequency range selection command, and an output on line 114 to supply a voltage controlled oscillator frequency responsive to the tuning voltage and frequency range selection.

The exclusive-OR (XOR) phase detector 122 has inputs to receive the NRZ data stream on line 104 and the voltage controlled oscillator frequency on line 114. The exclusive-OR phase detector 122 has an output on line 124 to supply the tuning voltage. The multiplexer 126 has signal inputs connected to the XOR and phase/frequency detector outputs on lines 124 and 118, respectively, a control input on line 128 to select a signal input, and an output connected to the voltage controlled oscillator input on line 130. As above, a loop-filter 120 is typically used to filter the tuning voltage. The multiplexer 126 selects the phase/frequency detector output on line 118 to acquire the NRZ data stream, and selects the XOR phase detector output on line 124 to track the NRZ data stream, after acquisition.

With respect to FIG. 3 only, the probability analyzer 108 has an input to receive mean frequency of transitions on line 106 from the transition detector 102. The probability analyzer 108 compares the mean frequency of transitions to the transition probability to supply a mean data stream rate (B) at an output on line 312, where B=Fd/P. The phase/frequency detector 116 has a first input connected to the output of the probability analyzer on line 312 to accept the mean data stream rate and a second input connected to the output of the VCO 110 on line 114 to accept the VCO frequency. In this aspect of the invention, the probability analyzer 108 acts as a factor of P scalar with respect to the NRZ data stream on line 104.

FIG. 4 illustrates an alternate aspect of the invention of FIG. 3, where the probability analyzer 108 acts as a factor of P scalar in the feedback path between the VCO 110 and the PFD 116. In system 400, the probability analyzer 108 has an input to receive the VCO frequency on line 114. In addition to supplying the compensated transition count on line 306 in response to the mean frequency of transitions on line 106, the probability analyzer 108 supplies the VCO frequency multiplied by P at an output on line 402. The phase/frequency detector 116 has a first input connected to the output of the transition detector 102 on line 106 to accept the mean frequency of transitions (Fd) and a second input on line 402 connected to the output of the probability analyzer 108 to accept the scaled VCO frequency.

With respect to either FIG. 3 or FIG. 4, the transition detector 102 determines a mean frequency of transitions (Fd) in the data stream on line 104 by monitoring: positive transitions having a 0.25 probability of occurrence; negative transitions having a 0.25 probability of occurrence; or, both positive and negative transitions having a 0.5 probability of occurrence. The transition detector 102 samples n data bits on line 104 and determines a mean frequency of transitions on line 106 with a standard deviation as follows:

$$\sigma=SQRT((P)(1-P)(n)).$$

FIG. 5 is a schematic block diagram illustrating the present invention system for generating a reference clock in the absence of a pseudorandom NRZ data stream. The system 500 comprises a transition detector 502 having an input on line 504 to sample a first pseudorandom NRZ data stream and an output on line 506 to supply a first mean frequency of transitions (Fd1). A probability analyzer 508 determines the transition probability (P) associated with the first mean frequency of transitions on line 506. The probability analyzer 508 is used in two aspects of the invention as explained in the description of FIGS. 5 and 6 below. As shown in FIG. 5, a line 510 from the transition detector 502, supplies the probability analyzer 508 with information necessary to calculate P.

A voltage controlled oscillator (VCO) 512 has an input on line 514 to accept a tuning voltage and an output on line 516 to supply a voltage controlled oscillator frequency first reference clock (refclk1) responsive to the tuning voltage on line 514. A reference source 518 has a first frequency output on line 520 responsive to the first mean frequency of transitions on line 506. The reference source 518 can be a combination micro-controller and digitally tunable oscillator, for example.

A phase/frequency detector (PFD) 522 is responsive to the first frequency on line 520, the transition probability, and the VCO frequency on line 516. The phase/frequency detector 522 has an output on line 524 to supply the tuning voltage. In some aspects, a loop-filter 526 filters the tuning voltage on line 524.

A clock data recovery (CDR) unit 527 has an input to receive the NRZ data stream on line 504 and an input to receive the first reference clock on line 516 for use in the absence of the NRZ data stream. When the transition detector 502 fails to supply a first mean frequency of transitions on line 506 in the absence of the first data stream on line 504. However, the reference source 518 has a memory 528 to store the first frequency, and supplies the first frequency on line 520 in the absence of the first mean frequency of transitions on line 506. The voltage controlled oscillator 512 generates a holdover clock responsive to the first reference.

With respect to FIG. 5 only, the probability analyzer 508 has an input to accept the VCO frequency on line 516. The probability analyzer multiplies the VCO frequency by P to supply a scaled VCO frequency at an output on line 530. The reference source 518 has an input connected to the transition detector 502 to supply a first frequency responsive to the first mean frequency of transitions on line 506. The phase frequency detector 522 has a first input to receive the first frequency on line 520 and a second input to receive the scaled VCO frequency on line 530. The probability analyzer 508 is used as a factor of P scalar in the feedback path between the VCO 512 and the PDF 522.

Figure 6:
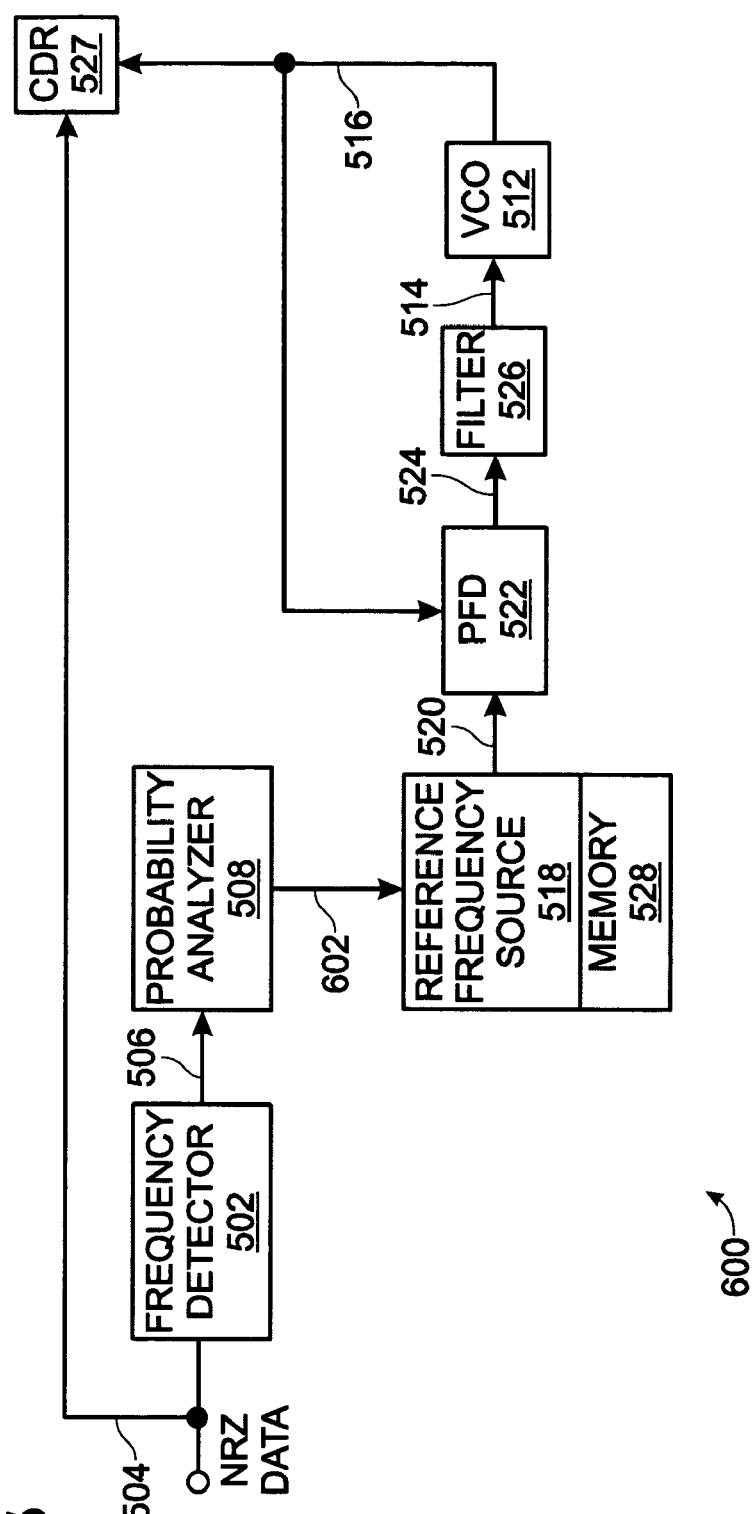
FIG. 6 illustrates an alternate aspect of the present invention system of FIG. 5, where the probability analyzer is used as a factor of P scalar with respect to the NRZ data input.

FIG. 6 illustrates an alternate aspect of the present invention system of FIG. 5, where the probability analyzer is used as a factor of P scalar with respect to the NRZ data input. In the system 600, the probability analyzer 508 has an input to accept the first mean frequency of transitions on line 506 and an output on line 602 to supply a first mean data stream rate (B1) from the comparison of the first mean frequency of transitions (Fd1) and the transition probability, where B1=Fd1/P. The reference source 518 has an input connected to the probability analyzer output on line 602 and supplies a first frequency on line 520 responsive to the first mean data stream rate. The phase/frequency detector 522 has a first input on line 520 to receive the first frequency and a second input on line 516 to receive the VCO frequency.

With respect to either FIG. 5 or FIG. 6, the transition detector 502 determines a mean frequency of transitions (Fd) in the data stream on line 504 by monitoring: positive transitions having a 0.25 probability of occurrence; negative transitions having a 0.25 probability of occurrence; or, both positive and negative transitions having a 0.5 probability of occurrence. The transition detector 502 samples n data bits on line 504 and determines a mean frequency of transitions with a standard deviation as follows:

$$\sigma = SQRT((P)(1-P)(n)).$$

In some aspects of the present invention systems 500 and 600, the NRZ data stream rate can change. Then, the transition detector 502 samples a second pseudorandom NRZ data stream on line 504 having a second mean frequency of transitions (Fd2), following the sampling of the first data stream and derives the second mean frequency of transitions on line 506. The reference source 518 generates a second frequency responsive to the second mean frequency of transitions. The phase/frequency detector 522 is responsive to the second reference source frequency, the transition probability, and the voltage controlled oscillator frequency, and the VCO 522 generates a voltage controlled oscillator output frequency second reference clock (refclk2). The CDR 527 uses the second reference clock to acquire the second data stream rate clock.

Functional Description of the System

The invention described herein provides a means of identifying the transmission rate of a binary NRZ data stream, based on direct measurement of unique statistical properties of transition density. The invention enables a method of fast, accurate and non-invasive identification of the transmission rate. The invention has applications in wide range clock recovery devices, providing a numerical approach to data rate identification and subsequent control of clock recovery PLL (phase locked loop) frequency acquisition. The invention offers a method for self-generation of reference clock for clock/data recovery (CDR) chips.

The invention takes advantage of certain statistical properties NRZ data streams with random or pseudorandom characteristics. Accumulated statistics have a direct correlation to data transmission rate, in bits/second. The basis for auto rate detection, also referred to herein as measuring the derived data stream rate, is supported by simple rules of probability. In terms of bit probabilities, transitions are statistically unique events in a random bit sequence.

Consider a stream of random binary data with equal probability of one or zero in any sample. By definition, positive transitions are a zero bit followed by a one bit. Therefore, the probability of a positive transition is 0.250. With an n-bit sample, the mean positive transition count is n/4, with diminishing uncertainty with large n. The same reasoning applies to measurements using negative transitions.

In practice the counter accumulates a count of positive transitions (Np) from a data stream, using a controlled gating time Td. Known accumulation time is essential to estimating the incoming serial data rate. The following relationship exists between the unknown serial data rate B, transition count Np, and the gating time Td:

$$B = 4NpTg.$$

To maintain a low level of measurement uncertainty, the bit sample size should be large. Np>250K represents a sample of about 1 million bits. Empirical data shows 6 sigma limits of +/−0.2% with a sample of 1 million bits. In general, the standard deviation, in units of B/4 is:

$$\sigma = SQRT(n \cdot P \cdot q),$$

where n is the count length, P=0.25 is the probability of a positive transition and q=(1−P) is the probability of not detecting a positive transition.

There are two ways to implement rate identification. One accumulates and reports Np for a known gating time. Another method reports the time required to accumulate a predetermined Np count. The fixed Np method insures constant measurement uncertainty at the expense of increased gating time for lower serial bit rates.

Simulations show the number of positive transitions is either equal to, or within one count of the number of negative transitions. Computer simulations using a random number generator, producing run lengths of 1E6 bits, consistently yield around 250K positive transitions. The six-sigma standard deviation of 17 separate runs was 0.2%. It is reasonable to assume that the positive transition count for N random bits will be about 0.248*N to 0.252*N.

Lab experiments were conducted to test the theory against actual data streams of two types; synchronous optical network (SONET) and pure pseudorandom bit stream (PRBS). An Agilent 8133A Pulse Generator, equipped with a limited resolution frequency counter, was used to complete the measurements because it exhibited good low frequency response. The frequency display had six digits and the gating time is estimated to be 100 milliseconds (mS). "x" indicates the digit is unstable.

TABLE 1

| | SONET Payload PRBS Length | | | | |
|---|---|---|---|---|---|
| | n = 11 | n = 15 | n = 23 | All Zeroes | All Ones |
| STS3 | 38.9x | 38.9x | 38.9x | 39.16x | 39.17x |
| STS12 | 155.3x | 155.3x | 155.3x | 155.55x | 155.6x |
| STS48 | 622.1x | 622.1x | 622.x | 626.88x | 626.91x |
| | PRBS Length | | | | |
| | n = 7 | n = 10 | n = 15 | n = 23 | n = 31 |
| STS3 | 39.185x | 38.971x | 38.88x | 38.88x | 38.8x |
| STS12 | 156.75x | 155.67x | 155.53x | 155.52x | 155.5x |
| STS48 | 626.98x | 622.69x | 622.10x | 622.080x | 622.x |

The table below (Table 2) shows the theoretical frequency range of positive transitions for popular data rates. Note that measured data fits comfortably in the range predicted by theory and simulation results. DW stands for digital wrapper. One form of the digital wrapper format is described in the International Telecommunications Union ITU-T G.709 (G.709) specification.

TABLE 2

| Service | Line Rate | Fp(min) | Fp(nom) | Fp(max) |
|---|---|---|---|---|
| STS4S + DW | 2666.057 | 661.182 | 666.514 | 671.846 |
| STS48 | 2488.320 | 617.103 | 622.080 | 627.057 |
| STS12 + DW | 666.514 | 165.296 | 166.629 | 167.962 |
| STS12 | 622.080 | 154.276 | 155.520 | 156.764 |
| STS3 + DW | 166.629 | 41.324 | 41.657 | 41.990 |
| STS3 | 155.520 | 38.569 | 38.880 | 39.191 |

In practice, auto rate detection acquires a direct count of positive transitions from the incoming data stream, without retiming or any form of signal processing. A time base is required to control count gating however. The time base stability need only be about 200 parts per million (ppm) or less for the short term gating interval.

With respect to FIGS. 3 and 4, the present invention data stream rate measuring system is useful for CDRs with a wide VCO tuning range, partitioned into subsets of frequency bands. The width of each band and the PLL acquisition characteristics are such that the VCO can acquire lock to any data rate that falls in the band. The derive data stream rate provides sufficient information to direct VCO band switching action.

High order bits of the gated counter are decoded into band select information. The CDR PLL is directed to the correct frequency band as a function of incoming data stream statistics. To maintain confidence in the count, the counter should accumulate at least 1 E6 bits at the lowest data rate. High-order bits of the counter are used by the band selection decoder.

Assuming a 10 mS second gating interval, the sample size for the lowest data rate (STS3) is 1,55520E6. The sample size for the highest rate (STS4S+DW) is 26.660571E6. The data transition counter range is 385,690 (STS3) and 6,718,460 (STS12+DW). In general, the data rate B is identified numerically by the unique positive transition counts associated with the rate, i.e. mean positive transition count is B/4. The mean transition count is decoded into CDR frequency bands. In some aspects, the frequency bands are kept less than 1 octave wide to prevent false locking by the CDR.

Frequency Agile Holdover Clock

Considering FIGS. 5 and 6, CDR/CSU designs intended for SONET applications enjoy a harmonic relationship among mainstream transport rates. A single frequency crystal oscillator (XO) is sufficient to meet the needs of CDR holdover clock stability, i.e. when the input data signal is lost. If a CDR/CSU is used in continuous rate applications, REFCLK generation must also have frequency agile attributes.

REFCLK generation with a DOS (direct digital synthesis) chip or external synthesizer offers a practical solution. DDS chips are efficient with extremely fine digitally-controlled tuning steps and frequency stability dependent only on the stability characteristics of its reference source, usually an XO. DDS devices operating to 20 MHz are at the low end of the cost spectrum. A low cost DDS chip can provide a reference to a multiplying PLL, meeting the demand for almost any REFCLK frequency. DOS synthesizers have a digital interface for frequency and phase control, available in serial or parallel formats, so a form of microcontroller device is required. The microcontroller provides multirate clock holdover support.

A phase-frequency detector (PFD), on chip, supports external REFCLK synthesis. The system also requires an external VCO and external loop filter. The external DOS chip produces a reference frequency for the multiplier PLL.

Operating Considerations

Several practical limits might be considered for successful implementation of the present invention. With respect to power conservation, the counter, calculator circuit, and gating circuit may be operated continuously or enabled on demand for power conservation. A dedicated control pin on the IC permits the circuitry to be operated continuously or only during a loss of signal (LOS) recovery.

Then, data stream rate measurement is initiated when the LOS alarm goes from active to the inactive state, indicating the presence of serial input data. The data stream rate measuring circuitry runs until 4 consecutive gating intervals with equal counts are detected. When this condition is met the transition counter loads band decoding logic with transition count data, forcing CDR to the appropriate frequency band and disabling circuits associated with the transition counters.

There are at least two ways to process line rate changes. Taking the LOS alarm from active to inactive status initiates new rate acquisition. If the transition counter is always online, it detects rate changes and updates band decode logic after 4 consecutive gate periods with equal counts. When the LOS bit goes to the active state, transition counters are disabled to avoid translating optical receiver thermal noise events to CDR band information. Active state LOS should also force the CDR to lock to the REFCLK source.

In frequency agile applications it is important to note that REFCLK isn't established until the CDR acquires locks to a valid serial data stream. At power-on with no serial input data, the REFCLK synthesizer has no reference. Applying serial data and taking the LOS bit from active to inactive state initiates rate identification and subsequent locking to the data stream. When the CDR locks to the data, its frequency sample output stabilizes and the external microcontroller adjusts the reference source (DDS or other) to the appropriate frequency.

The data stream rate measuring circuitry can also drive REFCLK decision circuits to establish REFCLK for the CDR. REFCLK pulls the VCO to the correct frequency. When lock to REFCLK is established, the CDR PLL reverts to the CDR function.

FIG. 7 is a flowchart illustrating the present invention method for method for synchronizing a reference clock to a pseudorandom NRZ data stream, in a clock data recovery system including a VCO and a PFD. Although the method (and the method described by FIGS. 8*a*, 8*b*, 9*a*, and 9*b* below) is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 700. Step 702 samples a pseudorandom NRZ data stream. Step 704 determines a mean frequency of transitions (Fd) in the data stream. Step 706 determines a transition probability (P) associated with the mean frequency of transitions. Step 708 uses a phase/frequency detector (PFD) responsive to a VCO frequency, the mean frequency of transitions, and the transition probability. Step 710, in response to using the phase/frequency detector, supplies a voltage controlled oscillator tuning voltage. Step 712 generates the VCO frequency responsive to the tuning voltage.

In some aspects of the method an exclusive-OR (XOR) phase detector is included, and the method comprises additional steps. Step 714, after generating the VCO frequency, uses a XOR phase detector to compare the VCO frequency to the NRZ data stream. Step 716, in response to using the XOR phase detector, supplies a voltage controlled oscillator tuning voltage. Step 718 generates the VCO frequency responsive to the tuning voltage.

In some aspects, Step 707a derives a mean data stream rate (B) from a comparison of the mean frequency of transitions and the transition probability, where B=Fd/P. Then, using a phase/frequency detector responsive to a VCO frequency, the mean frequency of transitions, and the transition probability in Step 708 includes comparing the mean data stream rate to the VCO frequency.

Alternately, Step 707b multiplies the VCO frequency by P to supply a scaled VCO frequency. Then, using a phase/frequency detector responsive to a VCO frequency, the mean frequency of transitions, and the transition probability in Step 708 includes comparing the scaled VCO frequency to the mean frequency of transitions.

In some aspects, determining a mean frequency of transitions (Fd) in the data stream in Step 704 includes determining the frequency of transitions from: positive transitions having a 0.25 probability of occurrence; negative transitions having a 0.25 probability of occurrence; or, both positive and negative transitions having a 0.5 probability of occurrence.

In other aspects, sampling a pseudorandom NRZ data stream in Step 702 includes sampling n data bits. Then, determining a mean frequency of transitions (Fd) in the data stream in Step 704 includes determining a mean frequency of transitions with a standard deviation as follows:

$$\sigma = SQRT((P)(1-P)(n)).$$

Figure 8B:
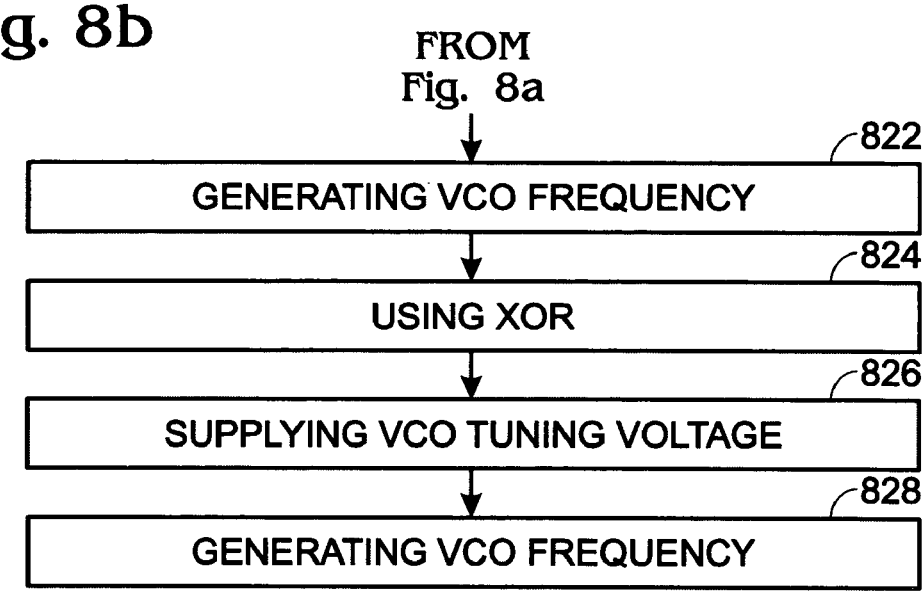

FIGS. 8a and 8b are flowcharts illustrating a method for synchronizing a reference clock to a pseudorandom NRZ data stream, in a clock data recovery system including a VCO and a PFD. The method starts at Step 800. Step 802 samples a pseudorandom NRZ data stream. Step 804 determines a mean frequency of transitions (Fd) in the data stream. Step 806 determines a transition probability associated with the mean frequency of transitions. Step 808 accumulates a mean transition count (Np) of frequency transitions over a gate time period (Td). Step 810 supplies a compensated transition count (Nc), where Nc=Np/P. Step 812 establishes a plurality of VCO frequency ranges. Step 814 determines a frequency range corresponding to the compensated transition count. Step 816 operates the voltage controlled oscillator within the determined frequency range. Step 818 uses a phase/frequency detector responsive to the VCO frequency, the mean frequency of transitions, and the transition probability. Step 820, in response to using the phase/frequency detector, supplies a voltage controlled oscillator tuning voltage. Step 822 generates the VCO frequency responsive to the tuning voltage.

In some aspects of the method an exclusive-OR (XOR) phase detector is included, and the method comprises further steps. Step 824, after generating the VCO frequency, uses a XOR phase detector to compare the VCO frequency to the NRZ data stream. Step 826, in response to comparing, supplies a voltage controlled oscillator tuning voltage. Step 828 generates the VCO frequency responsive to the tuning voltage.

In one aspect of the method Step 807a derives a mean data stream rate (B) from a comparison of the mean frequency of transitions and the transition probability, where B=Fd/P. Then, using a phase/frequency detector responsive to a VCO frequency, the mean frequency of transitions, and the transition probability in Step 818 includes comparing the mean data stream rate to the VCO frequency.

Alternately, Step 807b multiplies the VCO frequency by P to supply a scaled VCO frequency. Then, using a phase/frequency detector responsive to a VCO frequency, the mean frequency of transitions, and the transition probability in Step 818 includes comparing the scaled VCO frequency to the mean frequency of transitions.

Determining a mean frequency of transitions (Fd) in the data stream in Step 804 includes determining the frequency of transitions from: positive transitions having a 0.25 probability of occurrence; negative transitions having a 0.25 probability of occurrence; or, both positive and negative transitions having a 0.5 probability of occurrence.

Sampling a pseudorandom NRZ data stream in Step 802 includes sampling n data bits. Then, determining a mean frequency of transitions (Fd) in the data stream in Step 804 includes determining a mean frequency of transitions with a standard deviation as follows:

$$\sigma = SQRT((P)(1-P)(n)).$$

Figure 9B:
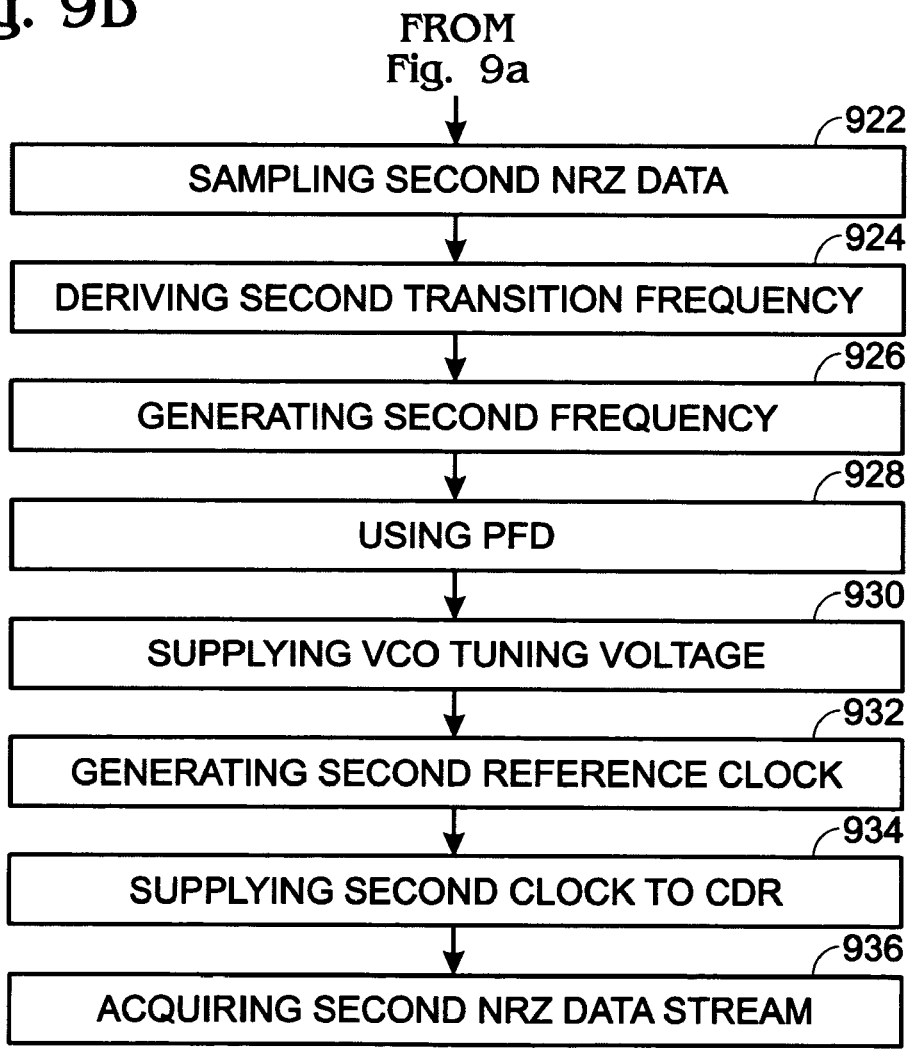

FIGS. 9a and 9b are flowcharts illustrating the present invention method for generating a reference clock in the absence of a pseudorandom NRZ data stream, in a system including a clock data recovery unit, a VCO, a PFD, and a reference frequency source. The method starts at Step 900. Step 902 samples a first pseudorandom NRZ data stream. Step 904 determines a first mean frequency of transitions (Fd1) in the first data stream. Step 906 determines a transition probability (P) associated with the first mean frequency of transitions (P). Step 908 generates a first reference source frequency responsive to the first mean frequency of transitions. Step 910 uses a phase/frequency detector responsive to the reference source frequency, the transition probability, and a voltage controlled oscillator frequency. Step 912, in response to using the phase/frequency detector, supplies a voltage controlled oscillator tuning voltage. Step 914 generates a voltage controlled oscillator frequency first reference clock (refclk1) responsive to the tuning voltage.

Some aspects of the method include further steps. Step 916 stores the first reference source frequency. Step 918, in the absence of a NRZ data stream, uses the first reference frequency in memory. Step 920 generates a voltage controlled oscillator frequency holdover clock responsive to the first reference source frequency.

In one aspect a further step, Step 907a derives a first mean data stream rate (B1) from a comparison of the first mean frequency of transitions (Fd1) and the transition probability, where B1=Fd1/P. Then, generating a first reference source frequency responsive to the first mean frequency of transitions in Step 908 includes generating a first reference source frequency in response to the first mean data stream rate. Using a phase frequency detector responsive to the reference source frequency, the transition probability, and a voltage controlled oscillator frequency in Step 910 includes comparing the first reference source frequency to the VCO frequency.

Alternately, Step 907b multiplies the VCO frequency by P to supply a scaled VCO frequency. Using a phase/frequency detector responsive to the reference source frequency, the transition probability, and a voltage controlled oscillator frequency in Step 908 includes comparing the first reference source frequency to the scaled VCO frequency.

Determining the mean frequency of transitions (Fd) in the data stream in Step 904 includes determining the frequency of transitions from: positive transitions having a 0.25 probability of occurrence; negative transitions having a 0.25 probability of occurrence; or, both positive and negative transitions having a 0.5 probability of occurrence.

Some aspects of the method include further steps. Step 922 samples a second pseudorandom NRZ data stream having a second mean frequency of transitions (Fd2), following the sampling of the first data stream. Step 924 derives the second mean frequency of transitions (Fd2). Step 926 generates a second reference source frequency responsive to the second mean frequency of transitions. Step 928 uses the phase/frequency detector responsive to the second reference source frequency, the transition probability, and the voltage controlled oscillator frequency. Step 930, in response to using the phase/frequency detector, supplies a voltage controlled oscillator tuning voltage. Step 932 generates a voltage controlled oscillator output frequency second reference clock (refclk2) responsive to the tuning voltage. Step 934 supplies the second reference clock to the clock data recovery circuit. Step 936 uses the second reference clock to acquire the second data stream rate clock.

System and method applications have been provided for a measured pseudorandom NRZ data stream rate. However, the present invention system and method have a wider field of use than just these limited number of examples. Neither is the invention limited to any particular communication format. Other variations and embodiments of the invention will occur to those skilled in the art.

I claim:

1. In a clock data recovery system including a voltage controlled oscillator (VCO) and a phase/frequency detector (PFD), a method for synchronizing a reference clock to a pseudorandom non-return to zero (NRZ) data stream, the method comprising:
   sampling a pseudorandom NRZ data stream;
   determining a mean frequency of transitions (Fd) in the data stream;
   determining a transition probability (P) associated with the mean frequency of transitions;
   using a phase/frequency detector (PFD) responsive to a VCO frequency, the mean frequency of transitions, and the transition probability;
   in response to using the phase/frequency detector, supplying a voltage controlled oscillator tuning voltage; and,
   generating the VCO frequency responsive to the tuning voltage.

2. The method of claim 1 in which an exclusive-OR (XOR) phase detector is included, and the method further comprising:
   after generating the VCO frequency, using a XOR phase detector to compare the VCO frequency to the NRZ data stream;
   in response to using the XOR phase detector, supplying a voltage controlled oscillator tuning voltage; and,
   generating the VCO frequency responsive to the tuning voltage.

3. The method of claim 2 further comprising:
   deriving a mean data stream rate (B) from a comparison of the mean frequency of transitions and the transition probability, where B= Fd/P; and,
   wherein using a phase/frequency detector responsive to a VCO frequency, the mean frequency of transitions, and the transition probability includes comparing the mean data stream rate to the VCO frequency.

4. The method of claim 2 further comprising:
   multiplying the VCO frequency by P to supply a scaled VCO frequency; and,
   wherein using a phase/frequency detector responsive to a VCO frequency, the mean frequency of transitions, and the transition probability includes comparing the scaled VCO frequency to the mean frequency of transitions.

5. The method of claim 2 wherein determining a mean frequency of transitions (Fd) in the data stream includes determining the frequency of transitions selected from the group including:
   positive transitions having a 0.25 probability of occurrence;
   negative transitions having a 0.25 probability of occurrence; and,
   both positive and negative transitions having a 0.5 probability of occurrence.

6. The method of claim 5 wherein sampling a pseudorandom NRZ data stream includes sampling n data bits, where n is a variable;
   wherein determining a mean frequency of transitions (Fd) in the data stream includes determining a mean frequency of transitions with a standard deviation ($\sigma$) as follows:

$\sigma = SQRT((P)(1-P)(n))$.

7. In a clock data recovery system including a voltage controlled oscillator (VCO) and a phase/frequency detector (PFD), a method for synchronizing a reference clock to a pseudorandom non-return to zero (NRZ) data stream, the method comprising:
   sampling a pseudorandom NRZ data stream;
   determining a mean frequency of transitions (Fd) in the data stream;
   determining a transition probability (P) associated with the mean frequency of transitions;
   accumulating a mean transition count (Np) of frequency transitions over a gate time period (Td);
   supplying a compensated transition count (Nc), where Nc= Np/P;
   establishing a plurality of VCO frequency ranges;
   determining a frequency range corresponding to the compensated transition count;
   operating the voltage controlled oscillator within the determined frequency range;
   using a phase/frequency detector responsive to the VCO frequency, the mean frequency of transitions, and the transition probability;
   in response to using the phase/frequency detector, supplying a voltage controlled oscillator tuning voltage; and,
   generating the VCO frequency responsive to the tuning voltage.

8. The method of claim 7 in which an exclusive-OR (XOR) phase detector is included, and the method further comprising:
   after generating the VCO frequency, using a XOR phase detector to compare the VCO frequency to the NRZ data stream;
   in response to comparing, supplying a voltage controlled oscillator tuning voltage; and,
   generating the VCO frequency responsive to the tuning voltage.

9. The method of claim 8 further comprising:
deriving a mean data stream rate (B) from a comparison of the mean frequency of transitions and the transition probability, where B= Fd/P; and,
wherein using a phase/frequency detector responsive to a VCO frequency, the mean frequency of transitions, and the transition probability includes comparing the mean data stream rate to the VCO frequency.

10. The method of claim 8 further comprising:
multiplying the VCO frequency by P to supply a scaled VCO frequency; and,
wherein using a phase/frequency detector responsive to a VCO frequency, the mean frequency of transitions, and the transition probability includes comparing the scaled VCO frequency to the mean frequency of transitions.

11. The method of claim 8 wherein determining a mean frequency of transitions (Fd) in the data stream includes determining the frequency of transitions selected from the group including:
positive transitions having a 0.25 probability of occurrence;
negative transitions having a 0.25 probability of occurrence; and,
both positive and negative transitions having a 0.5 probability of occurrence.

12. The method of claim 11 wherein sampling a pseudorandom NRZ data stream includes sampling n data bits, where n is a variable; and,
wherein determining a mean frequency of transitions (Fd) in the data stream includes determining a mean frequency of transitions with a standard deviation (C) as follows:

$$\sigma = SQRT((P)(1-P)(n)).$$

13. In a system including a clock data recovery (CDR) unit, a voltage controlled oscillator (VCO), a phase/frequency detector (PFD), and a reference frequency source, a method for generating a reference clock in the absence of a pseudorandom non-return to zero (NRZ) data stream, the method comprising:
sampling a first pseudorandom NRZ data stream;
determining a first mean frequency of transitions (Fd1) in the first data stream;
determining a transition probability (P) associated with the first mean frequency of transitions (Fd1);
generating a first reference source frequency responsive to the first mean frequency of transitions;
using a phase/frequency detector responsive to the reference source frequency, the transition probability, and a voltage controlled oscillator frequency;
in response to using the phase/frequency detector, supplying a voltage controlled oscillator tuning voltage; and,
generating a voltage controlled oscillator frequency first reference clock (refclk1) responsive to the tuning voltage.

14. The method of claim 13 further comprising:
storing the first reference source frequency;
in the absence of a NRZ data stream, using the first reference frequency in memory; and,
generating a voltage controlled oscillator frequency holdover clock responsive to the first reference source frequency.

15. The method of claim 14 further comprising:
deriving a first mean data stream rate (B1) from a comparison of the first mean frequency of transitions (Fd1) and the transition probability, where B1=Fd1/P;
wherein generating a first reference source frequency responsive to the first mean frequency of transitions includes generating a first reference source frequency in response to the first mean data stream rate; and,
wherein using a phase frequency detector responsive to the reference source frequency, the transition probability, and a voltage controlled oscillator frequency includes comparing the first reference source frequency to the VCO frequency.

16. The method of claim 15 further comprising:
multiplying the VCO frequency by P to supply a scaled VCO frequency; and
wherein using a phase/frequency detector responsive to the reference source frequency, the transition probability, and a voltage controlled oscillator frequency includes comparing the first reference source frequency to the scaled VCO frequency.

17. The method of claim 13 wherein determining the mean frequency of transitions (Fd) in the data stream includes determining the frequency of transitions selected from the group including:
positive transitions having a 0.25 probability of occurrence;
negative transitions having a 0.25 probability of occurrence; and,
both positive and negative transitions having a 0.5 probability of occurrence.

18. The method of claim 13 further comprising:
sampling a second pseudorandom NRZ data stream having a second mean frequency of transitions (Fd2), following the sampling of the first data stream;
deriving the second mean frequency of transitions;
generating a second reference source frequency responsive to the second mean frequency of transitions;
using the phase/frequency detector responsive to the second reference source frequency, the transition probability, and the voltage controlled oscillator frequency;
in response to using the phase/frequency detector, supplying a voltage controlled oscillator tuning voltage;
generating a voltage controlled oscillator output frequency second reference clock (refclk2) responsive to the tuning voltage;
supplying the second reference clock to the clock data recovery circuit; and,
using the second reference clock to acquire the second data stream rate clock.

19. In a communications device integrated circuit (IC), a system for synchronizing a reference clock to a pseudorandom non-return to zero (NRZ) data stream, the system comprising:
a transition detector having an input to sample a pseudorandom NRZ data stream and an output to supply a mean frequency of transitions (Fd);
a probability analyzer to determine the transition probability (P) for the mean frequency of transitions;
a voltage controlled oscillator (VCO) having an input to accept a tuning voltage and an output to supply a voltage controlled oscillator frequency responsive to the tuning voltage; and,
a phase/frequency detector (PFD) responsive to the mean frequency of transitions, the transition probability, and the VCO frequency, the phase/frequency detector having an output to supply the tuning voltage.

20. The system of claim 19 further comprising:
an exclusive-OR (XOR) phase detector having inputs to receive the NRZ data stream and the voltage controlled oscillator frequency, the exclusive-OR phase detector having an output to supply the tuning voltage;

a multiplexer having signal inputs connected to the XOR and phase/frequency detector outputs, a control input to select a signal input, and an output connected to the voltage controlled oscillator input; and, wherein the multiplexer selects the phase/frequency detector output to acquire the NRZ data stream, and selects the XOR phase detector output to track the NRZ data stream, after acquisition.

21. The system of claim 20 wherein the probability analyzer has an input to receive the VCO frequency, the probability analyzer multiplying the VCO frequency by P to supply a scaled VCO frequency at an output; and, wherein the phase/frequency detector has a first input connected to the output of the transition detector to accept the mean frequency of transitions (Fd) and a second input connected to the output of the probability analyzer to accept the scaled VCO frequency.

22. The method of claim 20 wherein the probability analyzer has an input to receive mean frequency of transitions from the transition detector, the probability analyzer comparing the mean frequency of transitions to the transition probability to supply a mean data stream rate (B) at an output, where B= Fd/P; and, wherein the phase/frequency detector has a first input connected to the output of the probability analyzer to accept the mean data stream rate and a second input connected to the output of the VCO to accept the VCO frequency.

23. The system of claim 20 wherein the transition detector determines a mean frequency of transitions (Fd) in the data stream selected from the group including:

positive transitions having a 0.25 probability of occurrence;

negative transitions having a 0.25 probability of occurrence; and, both positive and negative transitions having a 0.5 probability of occurrence.

24. The system of claim 20 wherein the transition detector samples n data bits, where n is a variable, and determines a mean frequency of transitions with a standard deviation ($\sigma$) as follows:

$\sigma = SQRT((P)(1-P)(n))$.

25. In a communications device integrated circuit (IC), a system for synchronizing a reference clock to a pseudorandom non-return to zero (NRZ) data stream, the system comprising:

a transition detector having an input to sample a pseudorandom NRZ data stream and an output to supply a mean frequency of transitions (Fd);

a gating circuit having an output to supply a gate time period (Td);

a probability analyzer having an input to receive the mean frequency of transitions and an input to accept the gate time period, the probability analyzer comparing a transition count of the mean frequency of transitions to a transition probability (P) and supplying a compensated transition count at an output;

a decoder having an input to accept the compensated transition count, the decoder determining a frequency range corresponding to the compensated transition count and supplying a frequency range selection command at an output;

a phase/frequency detector (PFD) responsive to the mean frequency of transitions, the transition probability, and the VCO frequency, the phase/frequency detector having an output to supply the tuning voltage; and, a multiband voltage controlled oscillator (VCO) having an input to accept a tuning voltage, an input to accept the frequency range selection command, and an output to supply a voltage controlled oscillator frequency responsive to the tuning voltage and frequency range selection.

26. The system of claim 25 further comprising:

an exclusive-OR (XOR) phase detector having inputs to receive the NRZ data stream and the voltage controlled oscillator frequency, the exclusive-OR phase detector having an output to supply the tuning voltage;

a multiplexer having signal inputs connected to the XOR and phase/frequency detector outputs, a control input to select a signal input, and an output connected to the voltage controlled oscillator input; and, wherein the multiplexer selects the phase/frequency detector output to acquire the NRZ data stream, and selects the XOR phase detector output to track the NRZ data stream, after acquisition.

27. The system of claim 26 wherein the probability analyzer has an input to receive the VCO frequency, the probability analyzer supplying the VCO frequency multiplied by P at an output; and, wherein the phase/frequency detector has a first input connected to the output of the transition detector to accept the mean frequency of transitions (Fd) and a second input connected to the output of the probability analyzer to accept the scaled VCO frequency.

28. The method of claim 26 wherein the probability analyzer has an input to receive mean frequency of transitions from the transition detector, the probability analyzer comparing the mean frequency of transitions to the transition probability to supply a mean data stream rate (B) at an output, where B= Fd/P; and, wherein the phase/frequency detector has a first input connected to the output of the probability analyzer to accept the mean data stream rate and a second input connected to the output of the VCO to accept the VCO frequency.

29. The system of claim 26 wherein the transition detector determines a mean frequency of transitions (Fd) in the data stream selected from the group including:

positive transitions having a 0.25 probability of occurrence;

negative transitions having a 0.25 probability of occurrence; and, both positive and negative transitions having a 0.5 probability of occurrence.

30. The system of claim 26 wherein the transition detector samples n data bits, where n is a variable, and determines a mean frequency of transitions with a standard deviation ($\sigma$) as follows:

$\sigma = SQRT((P)(1-P)(n))$.

31. A system for generating a reference clock in the absence of a pseudorandom non-return to zero (NRZ) data stream, the system comprising:

a transition detector having an input to sample a first pseudorandom NRZ data stream and an output to supply a first mean frequency of transitions (Fd1);

a probability analyzer to determine the transition probability (P) associated with the first mean frequency of transitions;

a voltage controlled oscillator (VCO) having an input to accept a tuning voltage and an output to supply a voltage controlled oscillator frequency first reference clock (refclk1) responsive to the tuning voltage;

a reference source having a first frequency output responsive to the first mean frequency of transitions;

a phase/frequency detector (PFD) responsive to the first frequency, the transition probability, and the VCO frequency, the phase/frequency detector having an output to supply the tuning voltage; and, a clock data recovery (CDR) unit having an input to receive the NRZ data stream and an input to receive the first reference clock for use in the absence of the NRZ data stream.

32. The system of claim 31 wherein the transition detector fails to supply a first mean frequency of transitions in the absence of the first data stream;

wherein the reference source has a memory to store the first frequency, and supplies the first frequency in the absence of the first mean frequency of transitions; and, wherein the voltage controlled oscillator generates a holdover clock responsive to the first reference.

33. The system of claim 31 wherein the probability analyzer has an input to accept the first mean frequency of transitions and an output to supply a first mean data stream rate (B1) from the comparison of the first mean frequency of transitions (Fd1) and the transition probability, where B1=Fd1/P;

wherein the reference source has an input connected to the probability analyzer output to supply a first frequency responsive to the first mean data stream rate; and, wherein the phase/frequency detector has a first input to receive the first frequency and a second input to receive the VCO frequency.

34. The system of claim 32 wherein the probability analyzer has an input to accept the VCO frequency, the probability analyzer multiplying the VCO frequency by P to supply a scaled VCO frequency at an output;

wherein the reference source has an input connected to the transition detector to supply a first frequency responsive to the first mean frequency of transitions; and, wherein the phase frequency detector has a first input to receive the first frequency and a second input to receive the scaled VCO frequency.

35. The system of claim 31 wherein the transition detector determines a mean frequency of transitions (Fd) in the data stream selected from the group including:

positive transitions having a 0.25 probability of occurrence;

negative transitions having a 0.25 probability of occurrence; and, both positive and negative transitions having a 0.5 probability of occurrence.

36. The system of claim 31 wherein the transition detector samples n data bits, where n is a variable, and determines a mean frequency of transitions with a standard deviation ($\sigma$) as follows:

$\sigma = SQRT((P)(1-P)(n))$.

37. The system of claim 31 wherein the transition detector samples a second pseudorandom NRZ data stream having a second mean frequency of transitions (Fd2), following the sampling of the first data stream and derives the second mean frequency of transitions;

wherein the reference source generates a second frequency responsive to the second mean frequency of transitions;

wherein the phase/frequency detector is responsive to the second reference source frequency, the transition probability, and the voltage controlled oscillator frequency;

wherein the VCO generates a voltage controlled oscillator output frequency second reference clock (refclk2); and, wherein the CDR uses the second reference clock to acquire the second data stream rate clock.

* * * * *